US008945997B2

(12) United States Patent
Zhang et al.

(10) Patent No.: US 8,945,997 B2
(45) Date of Patent: Feb. 3, 2015

(54) INTEGRATED CIRCUITS HAVING IMPROVED SPLIT-GATE NONVOLATILE MEMORY DEVICES AND METHODS FOR FABRICATION OF SAME

(71) Applicant: GLOBALFOUNDRIES Singapore Pte. Ltd., Singapore (SG)

(72) Inventors: Zufa Zhang, Singapore (SG); Khee Yong Lim, Singapore (SG); Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/929,393

(22) Filed: Jun. 27, 2013

(65) Prior Publication Data

US 2015/0001610 A1 Jan. 1, 2015

(51) Int. Cl.
*H01L 21/82* (2006.01)
*H01L 29/792* (2006.01)
*H01L 29/66* (2006.01)

(52) U.S. Cl.
CPC ........ *H01L 29/792* (2013.01); *H01L 29/66833* (2013.01)
USPC ...... 438/128; 438/257; 257/69; 257/E21.679; 257/314; 257/315

(58) Field of Classification Search
CPC .................. H01L 27/00; H01L 29/00
USPC ............. 438/128, 257; 257/E21.679, E21.69, 257/E27.103, E29.302, E29.309, 314, 315
See application file for complete search history.

(56) References Cited

U.S. PATENT DOCUMENTS

2008/0009115 A1*  1/2008  Willer et al. .................. 438/257
2010/0304556 A1   12/2010 Yin et al.
2011/0291227 A1* 12/2011  Toyama et al. ............... 257/506

* cited by examiner

*Primary Examiner* — Telly Green
(74) *Attorney, Agent, or Firm* — Ingrassia Fisher & Lorenz, P.C.

(57) ABSTRACT

Integrated circuits and methods for fabricating integrated circuits are provided. An exemplary method for fabricating an integrated circuit having a split-gate nonvolatile memory device includes forming a charge storage structure overlying a semiconductor substrate and having a first sidewall and a second sidewall and forming an interior cavity. The method forms a control gate in the interior cavity. Further, the method forms a first select gate overlying the semiconductor substrate and adjacent the first sidewall. A first memory cell is formed by the control gate and the first select gate. The method also forms a second select gate overlying the semiconductor substrate and adjacent the second sidewall. A second memory cell is formed by the control gate and the second select gate.

18 Claims, 6 Drawing Sheets

INTEGRATED CIRCUITS HAVING IMPROVED SPLIT-GATE NONVOLATILE MEMORY DEVICES AND METHODS FOR FABRICATION OF SAME

TECHNICAL FIELD

The present disclosure generally relates to integrated circuits and methods for fabricating integrated circuits, and more particularly relates to integrated circuits having improved split-gate nonvolatile memory devices and methods for fabricating integrated circuits with improved split-gate nonvolatile memory devices.

BACKGROUND

Integrated circuits find application in many of today's consumer electronics, such as cell phones, video cameras, portable music players, printers, computers, calculators, automobiles, etc. Integrated circuits may include a combination of active devices, passive devices and their interconnections.

In some instances, integrated circuits may take the form of nonvolatile memory, which can be an integrated circuit designed to store digital data in the form of an electrical charge. Uniquely, a nonvolatile memory charge remains in storage even after the power is turned off. Accordingly, the use of nonvolatile memory devices can be particularly advantageous for power saving applications or in applications where power can be interrupted.

Nonvolatile flash memory usually takes one of two forms, a stack gate form or a split-gate form. Nonvolatile memory cells utilizing the split-gate type structure typically employ a planar configuration wherein a control gate overlaps at least a portion of a floating gate. In conventional programming schemes, the programming current flows in a path parallel to the control gate, where a relatively small number of the programming electrons are injected into the control gate, thereby slowing program speed times.

Furthermore, as the current processing technology node continues to decrease, chip real estate has become one of the most critical elements of memory cell design. Unfortunately, both the control gate and select gate of a split-gate nonvolatile memory device consume precious chip area, thereby adversely impacting the memory cell capacity per fixed die area (e.g., the amount of information that can be stored in a defined area). Thus, a need still remains for a reliable integrated circuit and method of fabrication, wherein the integrated circuit exhibits improved programming speed, while increasing the amount of information that can be stored in a defined area.

Accordingly, it is desirable to provide integrated circuits having improved split-gate nonvolatile memory devices. In addition, it is desirable to provide integrated circuits and methods for fabricating integrated circuits with adjacent memory cells that share a control gate. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit having a split-gate nonvolatile memory device includes forming a charge storage structure overlying a semiconductor substrate and having a first sidewall and a second sidewall and forming an interior cavity. The method forms a control gate in the interior cavity. Further, the method forms a first select gate overlying the semiconductor substrate and adjacent the first sidewall. A first memory cell is formed by the control gate and the first select gate. The method also forms a second select gate overlying the semiconductor substrate and adjacent the second sidewall. A second memory cell is formed by the control gate and the second select gate.

In another embodiment, a method for fabricating an integrated circuit is provided and includes providing a semiconductor substrate having an upper surface and forming a trench in the semiconductor substrate. The method forms in the trench a charge storage structure that defines an interior cavity and includes an upper portion having a first sidewall and a second sidewall above the upper surface of the semiconductor substrate. A control gate is formed in the interior cavity. The method forms a first select gate overlying the upper surface of the semiconductor substrate and adjacent the first sidewall of the charge storage structure and a second select gate overlying the upper surface of the semiconductor substrate and adjacent the second sidewall of the charge storage structure. The first select gate and the control gate form a first memory cell and the second select gate and the control gate form a second memory cell.

In accordance with another embodiment, an integrated circuit is provided and includes a charge storage structure overlying a semiconductor substrate and having a first sidewall and a second sidewall and forming an interior cavity. A source/drain region is defined in the semiconductor substrate underlying the charge storage structure, a first control gate channel is defined in the semiconductor substrate adjacent the first sidewall, and a second control gate channel is defined in the semiconductor substrate adjacent the second sidewall. The integrated circuit further includes a control gate in the interior cavity. Also, the integrated circuit includes a first select gate overlying the semiconductor substrate and adjacent the first sidewall. A first select gate channel is defined underlying the first select gate, and a first memory cell is formed by the control gate and the first select gate. The integrated circuit further includes a second select gate overlying the semiconductor substrate and adjacent the second sidewall. A second select gate channel is defined underlying the second select gate, and a second memory cell is formed by the control gate and the second select gate.

BRIEF DESCRIPTION OF THE DRAWINGS

Embodiments of the integrated circuits having improved split-gate nonvolatile memory devices and methods for fabricating integrated circuits having improved split-gate nonvolatile memory devices will hereinafter be described in conjunction with the following drawing figures, wherein like numerals denote like elements, and wherein.

DETAILED DESCRIPTION

Figure 1:
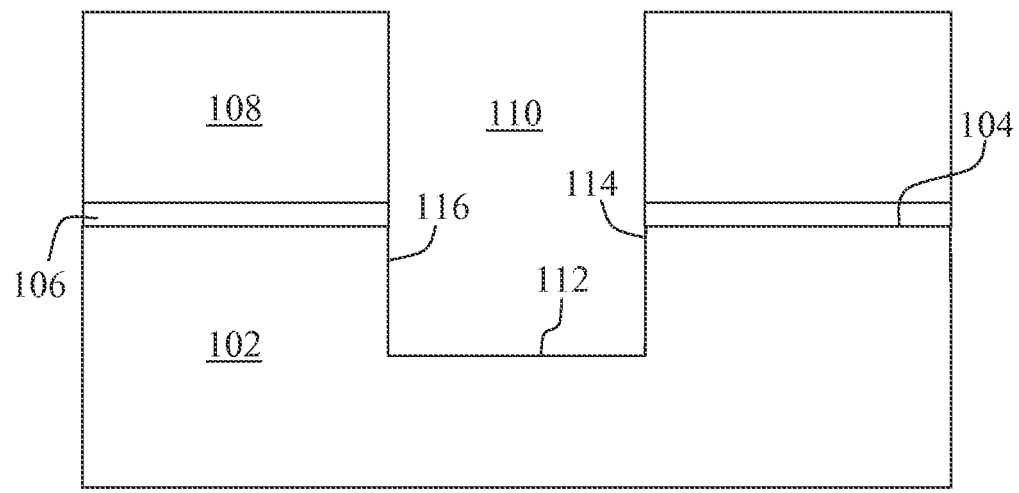
FIGS. 1-12 illustrate, in cross section, a portion of an integrated circuit and method steps for fabricating the integrated circuit in accordance with various embodiments herein.

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits having improved split-gate nonvolatile memory devices and methods for fabricating integrated circuits having improved split-gate nonvolatile memory devices are provided. Generally, the following embodiments relate to the formation of an integrated circuit including, but not limited to, a split-gate nonvolatile memory device that utilizes a shared vertical control gate to reduce memory cell area while providing improved programming speed. In an exemplary embodiment, the methods for fabricating integrated circuits include formation of a single control gate within a charge storage structure defining two vertical control gate channel regions. Further, the method includes forming select gates defining horizontal select gate channel regions adjacent the vertical control gate channel regions. As a result, the method provides for the formation of two flash memory cells that share the common control gate. As a result of the shared use of the control gate, wafer area used by the split-gate nonvolatile memory devices is reduced, providing for greater scaling.

FIGS. 1-12 illustrate sequentially a method for fabricating an integrated circuit having an improved split-gate nonvolatile memory device in accordance with various embodiments herein. The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components.

Turning now to FIG. 1, in an exemplary embodiment, the process of fabricating an integrated circuit 100 begins by providing a semiconductor substrate 102. The semiconductor substrate 102 for example is a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Further, the semiconductor substrate 102 may optionally include an epitaxial layer (epi layer). The semiconductor substrate 102 has an upper surface 104.

A dielectric layer, such as a sacrificial dielectric layer 106, is deposited overlying the upper surface 104. "As used herein "overlying" means "on" and "over". In this regard, the sacrificial dielectric layer 106 may lie directly on the upper surface 104 such that it makes physical contact with the upper surface 104 or it may lie over the upper surface such that another material layer, for example, another dielectric layer, is interposed between the upper surface 104 and sacrificial dielectric layer 106. An exemplary sacrificial dielectric layer 106 may include silicon oxide, silicon oxynitride, a silicon oxide/nitride/oxide stack, a high-k dielectric material (i.e., a material having a dielectric constant value greater than silicon oxide), or a combination thereof. The sacrificial dielectric layer 106 can be formed by thermal oxidation, atomic layer deposition (ALD), chemical vapor deposition (CVD), physical vapor deposition (PVD), or by other suitable methods.

In FIG. 1, a sacrificial spacer material 108 is deposited over the sacrificial dielectric layer 106. The sacrificial spacer material 108 may be selected for ease of processing as it is not present in the completed integrated circuit 100. In an exemplary embodiment, the sacrificial spacer material is silicon nitride and may be formed by chemical vapor deposition (CVD). As shown, a trench 110 is etched through the sacrificial spacer material 108, through the sacrificial dielectric layer 106, and into the semiconductor substrate 102, such as by conventional lithography steps. For example, a photoresist mask may be deposited and patterned over the sacrificial spacer material 108, and an etch process, such as reactive ion etch, performed. As shown, the trench 110 is bounded by a bottom surface 112, a first side surface 114, and a second side surface 116.

Figure 2:
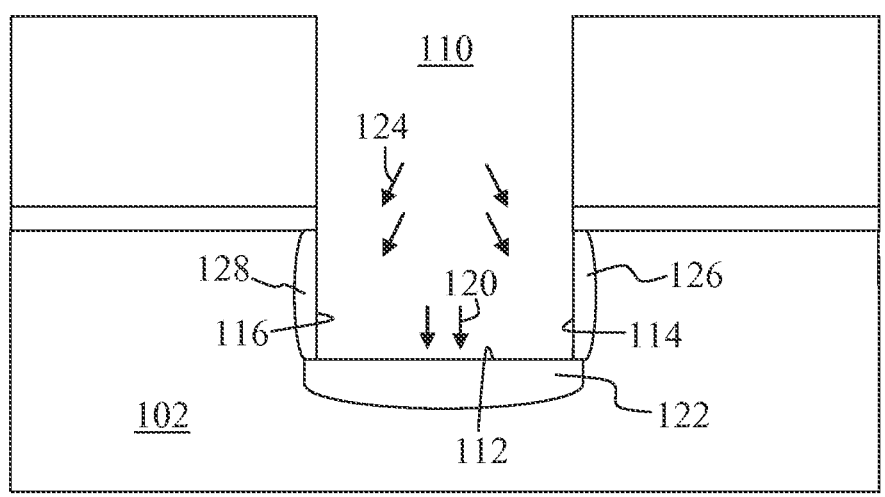

Ion implantation processes are performed as illustrated in FIG. 2. As shown, a first implantation process implants conductivity-determining ions 120 into the semiconductor substrate 102 at the bottom surface 112 of the trench 110 to form a doped region 122, such as a source/drain region. Second implantation processes implant conductivity-determining ions 124 into the semiconductor substrate 102 at the side surfaces 114 and 116 to form doped regions 126 and 128, such as channel regions. The doped regions 122, 126 and 128 can be formed by a medium to high dose implant, for example at a range of about 5E11 atoms/cm$^2$ to about 2E13 atoms/cm$^2$. The ions used to form the doped region 122, 126 and 128 may include n-type or p-type, depending on the type of device being formed (e.g., n-type ions for doped region 122 in an NFET device and p-type ions for doped region 122 in a PFET device).

Figure 3:
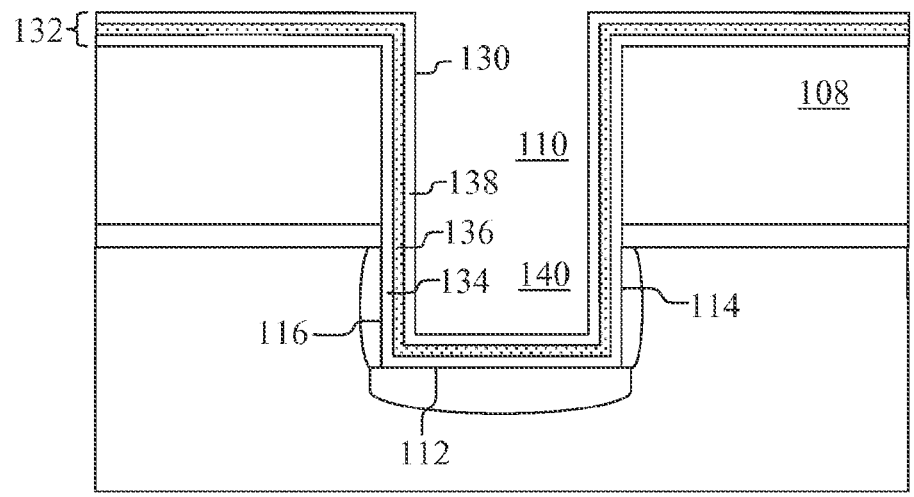

In FIG. 3, a charge storage structure 130 is formed in the trench 110. The exemplary charge storage structure 130 is formed from charge storage structure layers 132. Specifically, as shown, a lower dielectric layer 134 is globally deposited over the sacrificial spacer material 108 and the surfaces 112, 114 and 116 of the trench 110. A charge trapping layer 136 is then globally deposited over the lower dielectric layer 134, and an upper dielectric layer 138 is globally deposited over the charge trapping layer 136. The resulting charge storage structure 130 bounds an interior cavity 140 within the trench 110. As shown, the upper dielectric layer 138 overlies and encapsulates the charge trapping layer 136 and the lower dielectric layer 134.

The dielectric layers 134 and 138 can be made from materials including, but not limited to, silicon oxide, silicon nitride, silicon oxynitride, a high-k dielectric material (i.e., one having a dielectric constant value greater than silicon oxide), or a combination thereof, and may be any suitable material that permits induction and storage of a charge when an appropriate voltage is applied. Dielectric layers 134 and 138 may be thermally grown using an oxidizing or nitridizing ambient or deposited using a conventional chemical vapor deposition technique, physical vapor deposition technique, atomic layer deposition technique, or a combination thereof. The upper dielectric layer 138 can have the same or different composition compared to the lower dielectric layer 134 and may be formed using the same or different formation technique compared to the lower dielectric layer 134. Generally, the dielectric layers 134 and 138 can each have a thickness in a range of approximately 1 nanometer (nm) to approximately 10 nm, although it is to be understood that larger or smaller thickness may be used as well. Moreover, the thickness and the material selection of each of the dielectric layers 134 and 138 are selected based on the layers' desired electrical properties, e.g., desired write, erase, and programming speed characteristics.

In an embodiment, the charge trapping layer 136 is formed of a material capable of storing a charge. Examples of suitable materials capable of storing a charge include, but are not limited to, silicon, silicon germanium, a nitride, and metal-containing material. In an exemplary embodiment, the charge storage material includes discontinuous silicon nanocrystals or metal nanoclusters. It is to be understood that the terms nanocrystals and nanoclusters as used herein include charge storage materials that are not necessarily crystalline in structure. Generally, the charge trapping layer 136 may include nanocrystals and nanoclusters that range in maximum dimension or diameter between about 10 angstroms to about 150 angstroms, although it is understood that nanocrystals or nanoclusters having larger or smaller maximum dimensions or diameters can be used. However, it is to be understood that the nanocrystals and nanoclusters in the charge trapping layer 136 are not to be so large as to form a continuous structure (i.e., the nanocrystals and nanoclusters are to be discrete discontinuous elements). Additionally, it is to be understood that the shapes of the nanocrystals or nanoclusters within the charge trapping layer 136 need not necessarily be spherical and may include other non-spherical shapes as well. Moreover, it will be appreciated by those skilled in the art that the size and density of the charge trapping layer 136 can be strategically optimized to obtain desired write, erase, and programming speed characteristics The methods and techniques used to form the charge trapping layer 136 are well known within the art and not repeated herein.

Figure 4:
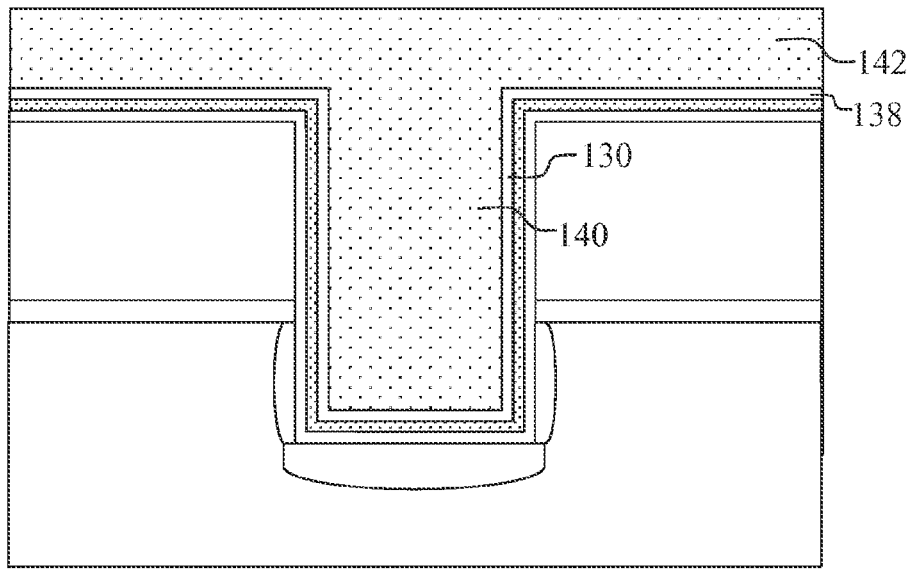

Referring now to FIG. 4, a control gate material 142 is deposited overlying the upper dielectric layer 138 in the interior cavity 140 of the charge storage structure 130. The control gate material 142 can be non-selectively formed over or on the integrated circuit 100, or more specifically over the upper dielectric layer 138 (e.g., conformally deposited within and adjacent the interior cavity 140). In an exemplary embodiment, the control gate material 142 is polysilicon, though it can be made from any conventional gate electrode-forming material including doped and undoped semiconducting materials (such as, for example, polysilicon, amorphous silicon, or silicon germanium), a metal, a metallic alloy, a silicide, a metal nitride, a metal oxide, a carbon nanotube, or a combination thereof. If the control gate material 142 includes a metal, the metal may include copper, tungsten, aluminum, aluminum alloy, palladium, titanium, tantalum, nickel, cobalt, and molybdenum. Furthermore, if the control gate material 142 includes a metal silicide, the metal silicide may include copper silicide, tungsten silicide, aluminum silicide, palladium silicide, titanium silicide, tantalum silicide, nickel silicide, cobalt silicide, erbium silicide, and molybdenum silicide. Other materials that may be known to those skilled in the art for gate structures may also be used for the control gate material 142. Generally, the control gate material 142 can be formed by CVD, PVD, silicidation, plating, and/or ALD. The control gate material 142 may also include a multilayer structure and/or a dual structure.

Figure 5:
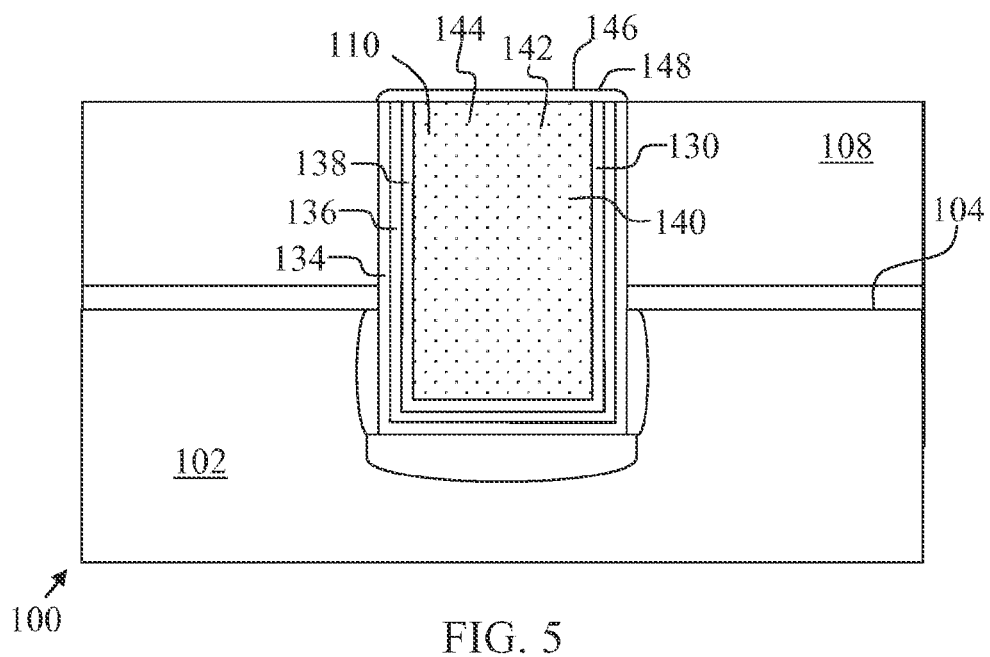

In FIG. 5, the overburden of the portions of the control gate material 142 and layers 134, 136, and 138, that is, those materials above the surface of the sacrificial spacer material 108, are removed. For example, a planarization process, such as chemical mechanical planarization (CMP), may be performed to remove all material above the sacrificial spacer material 108. As a result, the charge storage structure 130 is contained within the trench 110. Further, a control gate structure 144 is formed from the control gate material 142 and is contained entirely within the interior cavity 140 of the charge storage structure 130. With this structure, it can be seen that the layers 134, 136 and 138 may serve as a control gate dielectric layer for the control gate structure 144. In the exemplary embodiment, the charge storage structure 130 is formed along the entire length or height of the side surfaces 114 and 116 of trench 110. Further, the control gate structure 144 can be described as vertically oriented, meaning that the major axis of the control gate structure 144 lies in a plane that is perpendicular to the upper surface 104 of the semiconductor substrate 102.

Generally, the thickness of the control gate structure 144 (i.e., the width of the interior cavity 140) and the width of the trench 110 can be varied with the design specifications and/or the current technology process node (e.g., 45 nm, 32 nm, etc.) for the integrated circuit 100. It will be appreciated by those skilled in the art that the thickness of the control gate structure 144 can be modified and/or optimized during device design to reduce the area consumed by the unit cells of a nonvolatile memory structure. Moreover, the thickness of the control gate structure 144 can depend upon the desired write, erase, and programming speed characteristics of the integrated circuit 100. A gate cap portion 146 of a dielectric isolation layer 148 is formed over the charge storage structure 130 and control gate structure 144. An exemplary dielectric isolation layer 148 may include silicon oxide, silicon oxynitride, a silicon oxide/nitride/oxide stack, a high-k dielectric material (i.e., a material having a dielectric constant value greater than silicon oxide), or a combination thereof. The dielectric isolation layer 148 can be formed by wet oxidation, or by other suitable methods.

Figure 6:
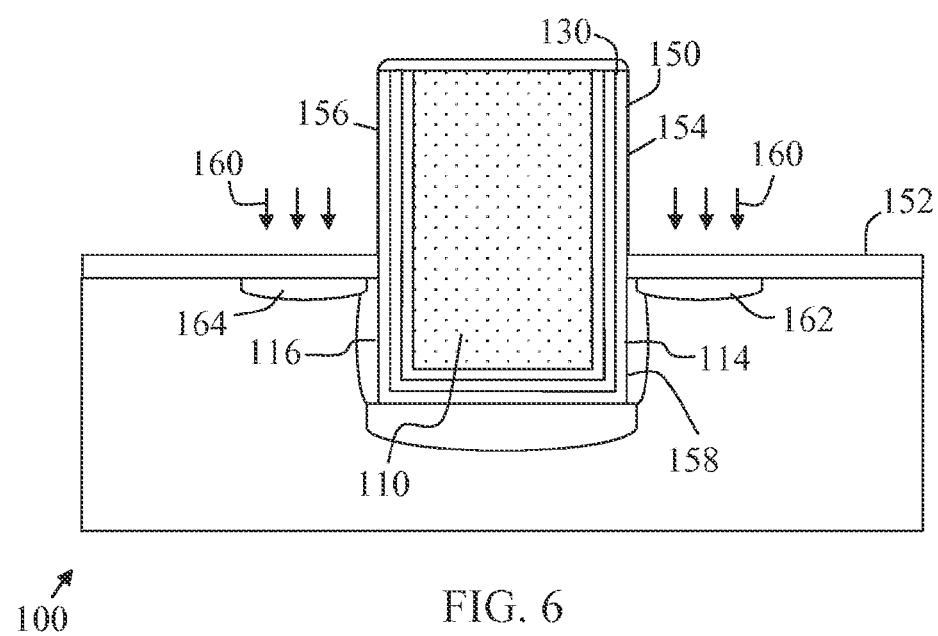

As shown in FIG. 6, the sacrificial spacer material 108 is removed from the integrated circuit 100. For example, a selective wet etch, using an etchant such as $H_3PO_4$ for silicon nitride or DHF for silicon oxide based spacer material, may remove a silicon nitride sacrificial spacer material 108. As a result of the removal of sacrificial spacer material 108, an upper portion 150 of the charge storage structure 130 above a surface 152 of the remaining structure of the integrated circuit 100 is exposed. Specifically, the charge storage structure 130 includes a first sidewall 154 and a second sidewall 156 that include lower portions 158 in contact with the side surfaces 114 and 116 of the trench 110 and exposed upper portions 150.

In FIG. 6, an ion implantation process is performed to form doped regions 162 and 164, such as channel regions later referred to as first select gate channel region and second select gate channel region. As shown, the conductivity-determining ions 160 are implanted into the semiconductor substrate 102 adjacent the first sidewall 154 of the charge storage structure 130 to form first select gate channel region 162 and into the semiconductor substrate 102 adjacent the second sidewall 156 of the charge storage structure 130 to form second select gate channel region 164. The doped regions 162 and 164 can be formed by a medium to high dose implant, for example at a range of about 5E11 atoms/cm$^2$ to about 2E13 atoms/cm$^2$. The ions used to form the doped regions 162 and 164 may include n-type or p-type, depending on the type of device being formed.

Figure 7:
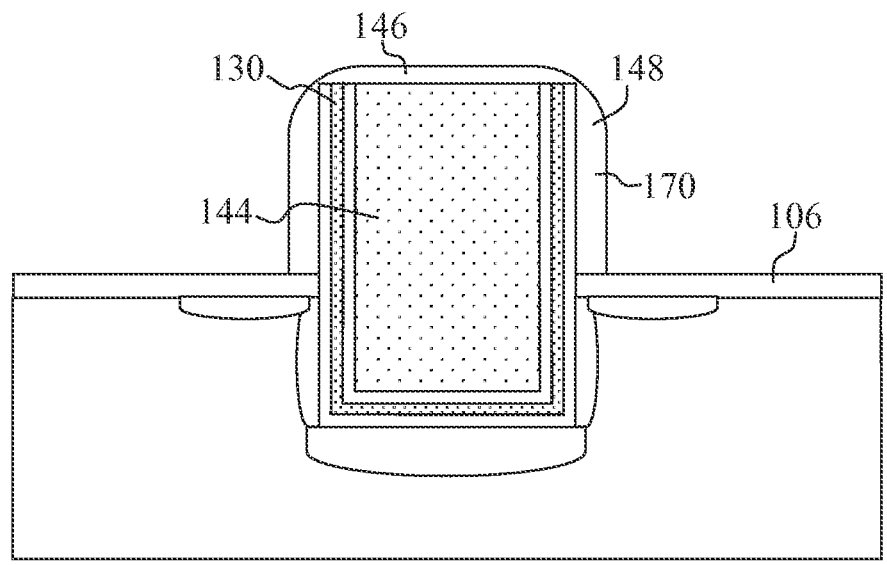

Sidewall portions 170 of the dielectric isolation layer 148 are formed around the charge storage structure 130 and control gate structure 144 in FIG. 7. Exemplary sidewall portions 170 of the dielectric isolation layer 148 may include silicon oxide, silicon oxynitride, a silicon oxide/nitride/oxide stack, a high-k dielectric material (i.e., a material having a dielectric constant value greater than silicon oxide), or a combination thereof. The sidewall portions 170 of the dielectric isolation layer 148 are conformally deposited such as by CVD, ALD, PVD, or by other suitable methods and are anisotropically dry etched. The sidewall portion 170 of the dielectric isolation layer 148 electrically isolates the control gate structure 144 from select gate structures formed hereafter.

Figure 8:
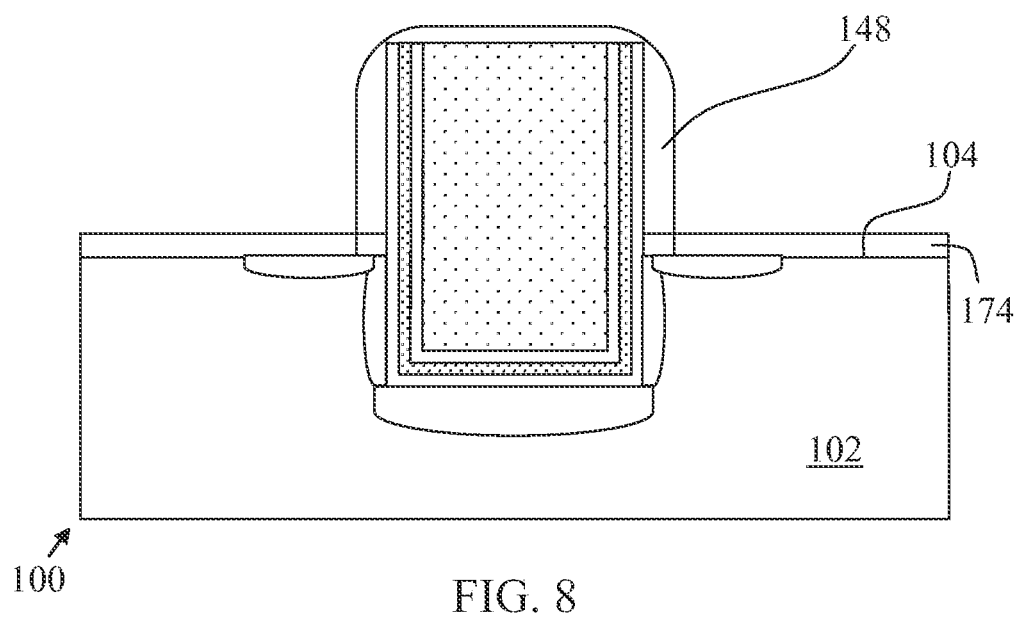

In FIG. 8, the sacrificial dielectric layer 106 is removed from the semiconductor substrate 102. Then, a select gate dielectric layer 174 is epitaxially grown or deposited over the upper surface 104 of the semiconductor substrate 102. An exemplary select gate dielectric layer 174 may include silicon oxide, silicon oxynitride, a silicon oxide/nitride/oxide stack, a high-k dielectric material (i.e., a material having a dielectric constant value greater than silicon oxide), or a combination thereof. The select gate dielectric layer 174 can be formed by thermal oxidation, atomic layer deposition (ALD), chemical vapor deposition (CVD), physical vapor deposition (PVD), or by other suitable methods. The select gate dielectric layer 174 may also include a multilayer structure and/or different materials for n-channel field effect transistor (NFET) and p-channel field effect transistor (PFET) devices. In at least one embodiment, the select gate dielectric layer 174 may include a multi-layer structure, such as a first layer of an oxide and a second layer of a high-k material.

Figure 9:
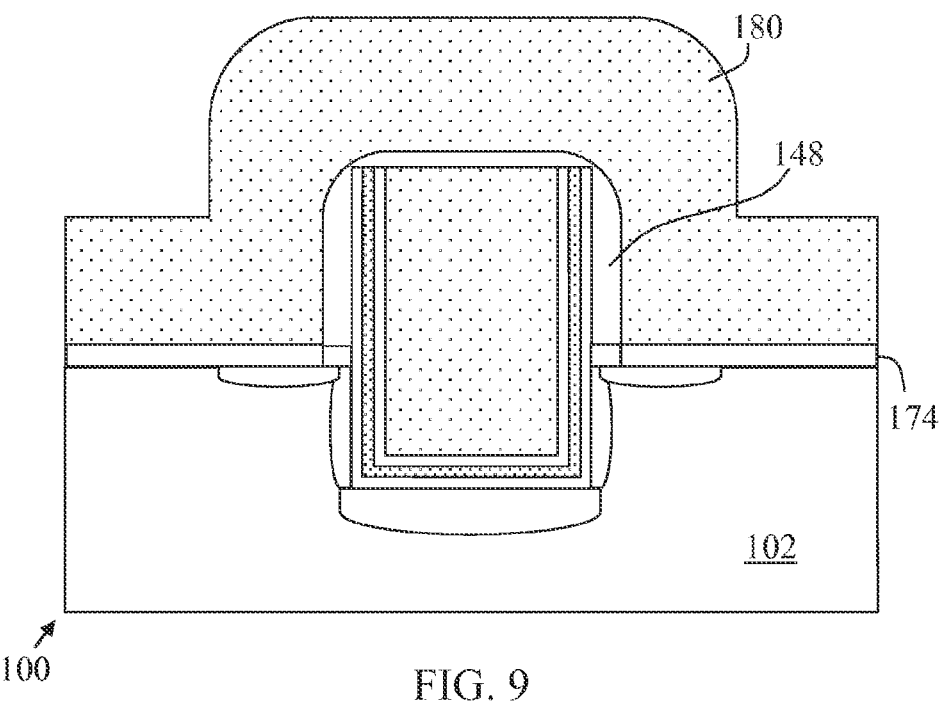

In FIG. 9, a select gate material 180 is conformally deposited overlying the select gate dielectric layer 174 and the charge storage structure 130. The select gate material 180 can be conformally deposited over the dielectric isolation layer 148 and select gate dielectric layer 174. An exemplary select gate material 180 is polysilicon though it can be any conventional material including doped and undoped semiconducting materials (such as, for example, polysilicon, amorphous silicon, or silicon germanium), a metal, a metallic alloy, a silicide, a metal nitride, a metal oxide, a carbon nanotube, or a combination thereof. If the select gate material 180 includes a metal, the metal may include copper, tungsten, aluminum, aluminum alloy, palladium, titanium, tantalum, nickel, cobalt, and molybdenum. Furthermore, if the select gate material 180 includes a metal silicide, the metal silicide may include copper silicide, tungsten silicide, aluminum silicide, palladium silicide, titanium silicide, tantalum silicide, nickel silicide, cobalt silicide, erbium silicide, and molybdenum silicide. Other materials, which may be known to those skilled in the art for gate structures, may also be used for the select gate material 180. Generally, the select gate material 180 can be formed by CVD, PVD, silicidation, plating, and/or ALD. The select gate material 180 may also include a multi-layer structure and/or a dual structure.

Figure 10:
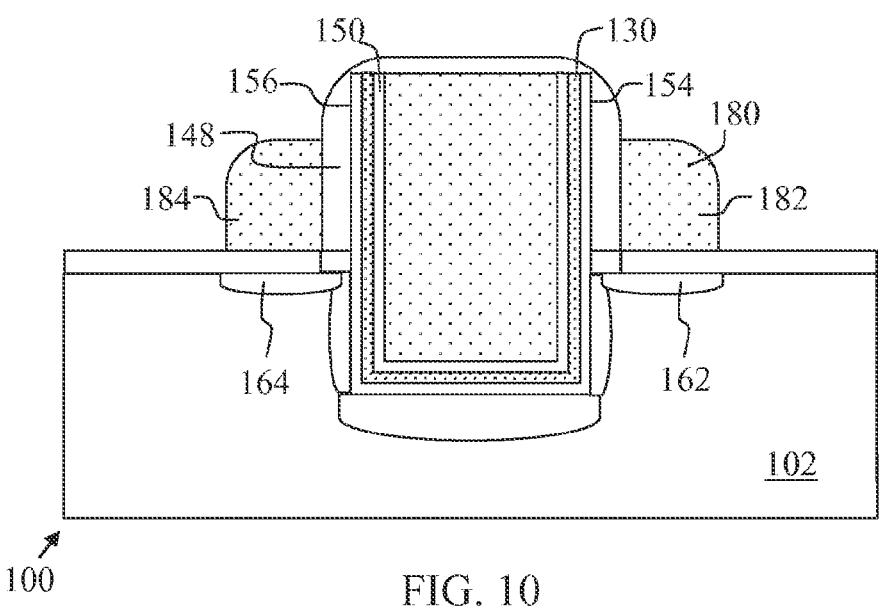

As illustrated in FIG. 10, the select gate material 180 is etched to form a first select gate structure 182 adjacent the upper portion 150 of the first sidewall 154 of the charge storage structure 130, and to form a second select gate structure 184 adjacent the upper portion 150 of the second sidewall 156 of the charge storage structure 130. As shown, the dielectric isolation layer 148 separates each select gate structure 182 and 184 from the respective sidewall 154 and 156. Further, the first select gate structure 182 lies over the first select gate channel region 162 and the second select gate structure 184 lies over the second select gate channel 164.

In an exemplary method, the select gate material 180 is polysilicon and is etched in a two-step process. First, the select gate material 180 is planarized to a common height with other components in logic devices (not shown) on the semiconductor substrate 102. Then, the select gate material 180 is etched during a process etching all polysilicon components on the semiconductor substrate 102, such as by a reactive ion etch or other suitable etch processes.

Generally, the thickness of the select gate structures 182 and 184 can be varied with the design specifications and/or the current technology process node (e.g., 45 nm, 32 nm, etc.) for the integrated circuit 100 and can be modified and/or optimized during device design to reduce the area consumed by a nonvolatile memory structure. Moreover, the thickness of the select gate material 180 can depend upon the desired write, erase, and programming speed characteristics of the integrated circuit 100.

Figure 11:
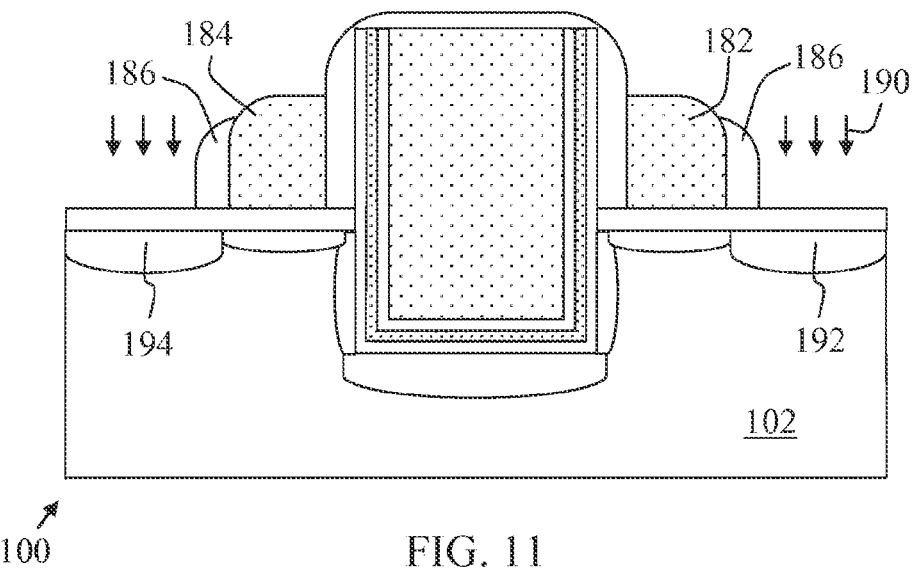

In FIG. 11, spacers 186 are formed around the select gate structures 182 and 184. Exemplary spacers 186 are silicon nitride formed by chemical vapor deposition (CVD). After formation of spacers 186, ion implantation processes are performed to implant conductivity-determining ions 190 into the semiconductor substrate 102 adjacent the spacers 186 around select gate structures 182 and 184 to form doped regions 192 and 194, such as drain/source regions. The ions used to form the doped regions 192 and 194 may include n-type or p-type, depending on the type of device being formed (e.g., p-type ions for doped regions 192 and 194 in an NFET device and n-type ions for doped regions 192 and 194 in a PFET device). While not illustrated, source/drain extension regions may be formed in the semiconductor substrate under the spacers 186.

Figure 12:
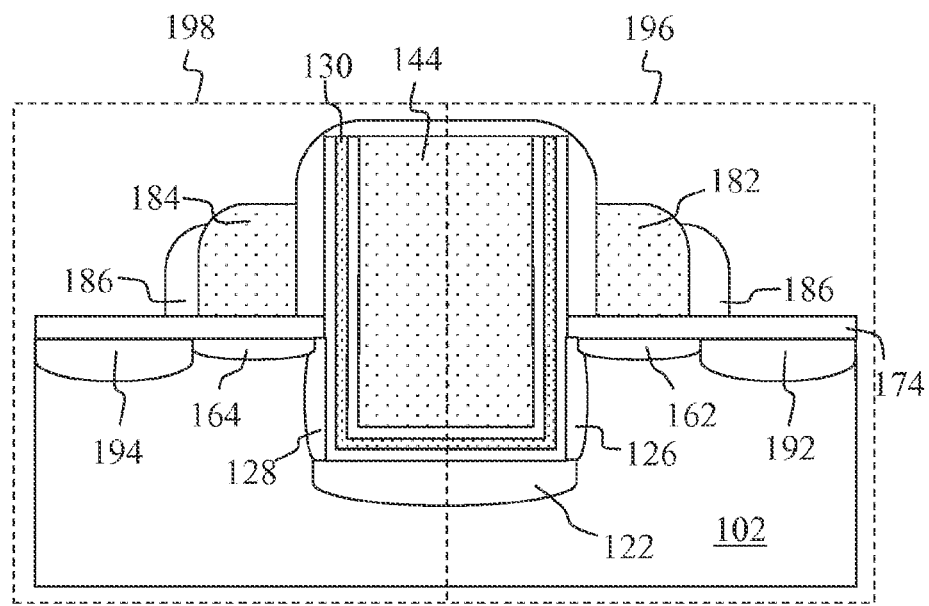

FIG. 12 illustrates a partially completed integrated circuit 100. In various embodiments, the method may continue to include process steps such as formation of contacts, interconnect structures (e.g., lines and vias, metal layers, and interlayer dielectric material). In FIG. 12, the integrated circuit 100 includes a split-gate nonvolatile memory device formed by two adjacent memory cells 196 and 198 that share control gate structure 144, charge storage structure 130 and source/drain region 122. Further, memory cell 196 provides a carrier path from source/drain region 122 to drain/source 192 through control gate channel region 126 and select gate channel region 162. Likewise, memory cell 198 provides a carrier path from source/drain region 122 to drain/source 194 through control gate channel region 128 and select gate channel region 164.

As a result of the structure described herein, the area of memory cells 196 and 198 is reduced as compared to the prior art. Specifically, memory cell area is reduced as a result of (1) having two memory cells share the vertical control gate, (2) positioning the source/drain region 122 beneath the control gate structure 144 rather than adjacent to the control gate structure 144, and (3) providing a vertical control gate channel regions 126 and 128.

Also, the described integrated circuit 100 is provided with enhanced programming efficiency as a result of pointing the major axes of the horizontal select gate channel regions 162 and 164 at the control gate. With this structural arrangement, almost all electrons can be injected to the charge storage structure 130 by ballistic channel hot electron injection (CHEI) via the source sides. Further, integrated circuit device variation may be minimized due to decreasing stored charge amount with scaling. Specifically, the height of the charge storage structure is defined by the trench 110 depth rather than by a lateral width, and therefore need not shrink to save device area.

In summary, a fabrication process is implemented to form an integrated circuit with improved split-gate nonvolatile memory devices. The wafer area used by improved split-gate nonvolatile memory devices is reduced as compared to conventional devices. Further, the integrated circuit is provided with enhanced programming efficiency and minimized device variation.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
   forming a source/drain region in a semiconductor substrate;
   forming a charge storage structure overlying the semiconductor substrate and having a first sidewall and a second sidewall and forming an interior cavity overlying the source/drain region;
   forming a control gate in the interior cavity;
   forming a first select gate overlying the semiconductor substrate and adjacent the first sidewall, wherein a first memory cell is formed by the control gate and the first select gate; and
   forming a second select gate overlying the semiconductor substrate and adjacent the second sidewall, wherein a second memory cell is formed by the control gate and the second select gate.

2. The method of claim 1 further comprising:
   forming a first drain/source region in the semiconductor substrate adjacent the first select gate; and
   forming a second drain/source region in the semiconductor substrate adjacent the second select gate.

3. The method of claim 1 further comprising:
   forming a first control gate channel in the semiconductor substrate adjacent the first sidewall;
   forming a second control gate channel in the semiconductor substrate adjacent the second sidewall;
   forming a first select gate channel in the semiconductor substrate the first select gate is formed overlying the first select gate channel; and
   forming a second select gate channel in the semiconductor substrate, wherein the second select gate is formed overlying the second select gate channel.

4. The method of claim 1 wherein forming a control gate comprises depositing polysilicon in the interior cavity, and wherein forming a first select gate and forming a second select gate comprise depositing and etching polysilicon overlying the semiconductor substrate.

5. The method of claim 1 further comprising etching a trench in the semiconductor substrate, wherein the trench defines a first side surface, a second side surface, and a bottom surface, wherein forming the source/drain region in the semiconductor substrate comprises forming the source/drain region at the bottom surface, and wherein forming a charge storage structure comprises depositing charge storage structure layers overlying the first side surface, the second side surface, and the bottom surface of the trench.

6. The method of claim 5 further comprising:
   performing an ion implantation on the first side surface and the second side surface to form a first control gate channel region and a second control gate channel region in the semiconductor substrate.

7. The method of claim 5 wherein forming a charge storage structure comprises:
   depositing a lower dielectric layer overlying the first side surface, the second side surface, and the bottom surface of the trench;
   depositing a charge trapping layer overlying the lower dielectric layer; and
   depositing an upper dielectric layer overlying the charge trapping layer.

8. The method of claim 1 further comprising:
   depositing a select gate dielectric layer overlying an upper surface of the semiconductor substrate;
   depositing a spacer material overlying the select gate dielectric layer;
   etching through the spacer material and the select gate dielectric layer and into the semiconductor substrate to form a trench bounded by a first side surface, a second side surface and a bottom surface formed in the semiconductor substrate;
   wherein forming a charge storage structure comprises depositing charge storage structure layers overlying the first side surface, the second side surface, and the bottom surface of the trench, and wherein the charge storage structure includes upper portions of the first sidewall and the second sidewall extending above the upper surface of the semiconductor substrate.

9. The method of claim 8 wherein forming a charge storage structure comprises depositing charge storage structure layers overlying the spacer material and the trench, wherein forming a control gate in the interior cavity comprises depositing a control gate material overlying the charge storage structure layers, and wherein the method further comprises:
   planarizing the control gate material and the charge storage structure layers to the spacer material; and
   removing the spacer material and exposing the upper portions of the charge storage structure.

10. The method of claim 1 further comprising:
    performing an ion implantation on the semiconductor substrate to form a first select gate channel region and a second select gate channel region in the semiconductor substrate; wherein forming the first select gate comprises forming the first select gate overlying the first select gate channel region and forming a second select gate comprises forming the second select gate overlying the second select gate channel region.

11. A method for fabricating an integrated circuit having a split-gate nonvolatile memory device, the method comprising:
    providing a semiconductor substrate having an upper surface;
    depositing a dielectric layer overlying the upper surface of the semiconductor substrate;
    depositing a spacer material overlying the dielectric layer;
    etching through the spacer material and the select gate dielectric layer and into the semiconductor substrate to form a trench in the semiconductor substrate;
    forming a charge storage structure in the trench, wherein the charge storage structure defines an interior cavity and wherein the charge storage structure includes an upper portion having a first sidewall and a second sidewall above the upper surface of the semiconductor substrate;
    forming a control gate in the interior cavity;
    forming a first select gate overlying the upper surface of the semiconductor substrate and adjacent the first sidewall of the charge storage structure, wherein the first select gate and the control gate form a first memory cell; and
    forming a second select gate overlying the upper surface of the semiconductor substrate and adjacent the second sidewall of the charge storage structure, wherein the second select gate and the control gate form a second memory cell.

12. The method of claim 11 wherein the trench is bounded by a bottom surface, a first side surface, and a second side surface, the method further comprising:
performing an ion implantation on the first side surface and the second side surface to form a first control gate channel region and a second control gate channel region in the semiconductor substrate; and
performing an ion implantation on the bottom surface to form a source/drain region in the semiconductor substrate.

13. The method of claim 11 wherein forming a charge storage structure comprises depositing charge storage structure layers overlying the spacer material and the trench, wherein forming a control gate in the interior cavity comprises depositing a control gate material overlying the charge storage structure layers, and wherein the method further comprises:
planarizing the control gate material and the charge storage structure layers to the spacer material; and
removing the spacer material and exposing the upper portion of the charge storage structure.

14. The method of claim 13 further comprising:
forming a dielectric cap overlying the control gate; and
performing an ion implantation on the upper surface of the semiconductor substrate adjacent the first sidewall and the second sidewall of the charge storage structure to form a first select gate channel region and a second select gate channel region in the semiconductor substrate.

15. The method of claim 14 further comprising forming additional dielectric material on the dielectric cap, the first sidewall, and the second sidewall of the charge storage structure; wherein forming a first select gate and forming a second select gate comprise:
depositing select gate material overlying the additional dielectric material; and
etching the select gate material to form the first select gate and the second select gate.

16. The method of claim 15 wherein forming a control gate in the interior cavity comprises depositing polysilicon overlying the charge storage structure layers, and wherein forming a dielectric cap overlying the control gate comprises epitaxially growing material on the polysilicon.

17. The method of claim 11 wherein the trench is bounded by a bottom surface, a first side surface, and a second side surface, and wherein forming a charge storage structure in the trench comprises:
depositing a lower dielectric layer overlying the upper surface of the semiconductor substrate and along the first side surface, the bottom surface, and the second side surface of the trench;
depositing a charge trapping layer overlying the lower dielectric layer; and
depositing an upper dielectric layer overlying the charge trapping layer.

18. The method of claim 11 further comprising performing an ion implantation on the upper surface to form a first drain/source region in the semiconductor substrate adjacent the first select gate and a second drain/source region in the semiconductor substrate adjacent the second select gate.

* * * * *